(12) United States Patent
Kim

(10) Patent No.: US 6,767,788 B2
(45) Date of Patent: Jul. 27, 2004

(54) SEMICONDUCTOR DEVICE HAVING A METAL INSULATOR METAL CAPACITOR

(75) Inventor: Si Bum Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/152,843

(22) Filed: May 23, 2002

(65) Prior Publication Data

US 2002/0185671 A1 Dec. 12, 2002

(30) Foreign Application Priority Data

Jun. 12, 2001 (KR) ..................... P2001-32906

(51) Int. Cl.[7] ......................................... H01L 21/8242
(52) U.S. Cl. .............. 438/253; 438/244; 438/387; 438/396; 257/303; 257/306
(58) Field of Search ................. 438/253, 244, 438/387, 396, 243, 250, 386; 257/303, 306, 301

(56) References Cited

U.S. PATENT DOCUMENTS

| | | | |
|---|---|---|---|
| 5,595,937 A | | 1/1997 | Mikagi |
| 6,080,529 A | | 6/2000 | Ye et al. |
| 6,117,747 A | | 9/2000 | Shao et al. |
| 6,271,084 B1 | * | 8/2001 | Tu et al. ................. 438/253 |
| 6,329,234 B1 | * | 12/2001 | Ma et al. ................. 438/210 |
| 6,344,964 B1 | * | 2/2002 | Adler ..................... 361/306.3 |
| 6,346,454 B1 | * | 2/2002 | Sung et al. ............... 438/396 |
| 6,399,399 B2 | * | 6/2002 | Yamamoto ................... 438/3 |
| 6,441,419 B1 | * | 8/2002 | Johnson et al. ............ 257/296 |
| 6,445,023 B1 | * | 9/2002 | Vaartstra et al. .......... 257/295 |
| 6,452,251 B1 | * | 9/2002 | Bernstein et al. ......... 257/532 |
| 6,500,675 B2 | * | 12/2002 | Takata et al. ................ 438/3 |
| 6,554,914 B1 | * | 4/2003 | Rozbicki et al. ........... 148/238 |
| 6,555,431 B1 | * | 4/2003 | Xing et al. ................ 438/253 |
| 2002/0155676 A1 | * | 10/2002 | Stetter et al. ............. 438/396 |
| 2002/0167086 A1 | * | 11/2002 | Stauf et al. ................ 257/751 |

OTHER PUBLICATIONS

Chung, International SEMATECH, Technology Transfer #00083985A–ENG, pp. 1–12 (2000).

\* cited by examiner

*Primary Examiner*—Long Pham
*Assistant Examiner*—Thao X. Le
(74) *Attorney, Agent, or Firm*—Brich, Stewart, Kolasch & Brich, LLP

(57) ABSTRACT

A semiconductor has a MIM capacitor formed on the same level with a dual damascene Cu line. The semiconductor includes a first insulating interlayer with first contact holes, first metal lines formed in the first contact holes, and second and third insulating interlayers including the first metal lines. Second and third contact holes are formed in the second insulating interlayer to expose some region of the first metal lines, a trench is formed in the third insulating interlayer corresponding to the second and third contact holes, and a capacitor structure is formed in the second contact hole and the trench above the second contact hole. Second metal lines fill the second and third contact holes and the trenches above the second and third contact holes.

9 Claims, 3 Drawing Sheets

SEMICONDUCTOR DEVICE HAVING A METAL INSULATOR METAL CAPACITOR

FIELD OF THE INVENTION

The present invention relates to a semiconductor device having a metal insulator metal (MIM) capacitor on the same level with a dual damascene Cu line.

BACKGROUND OF THE RELATED ART

A passive component having a capacitor is an integral part of many logic devices. This capacitor includes a decoupling capacitor of a MPU (Microprocessing Unit) device, a coupling and bypass capacitor for impedance matching between respective blocks in a SOC (System On a Chip) device and an RF device, and a capacitor array in an analogue-to-digital converter or a digital-to-analogue converter.

The related art obtains this capacitor by utilizing a junction capacitor having a silicon junction. Also, a MIM capacitor of Al/SiN/Al which uses a Plasma Enhanced Chemical Vapor Deposition (PECVD) SiN film as a dielectric film has been used in a general Al line technique.

However, a capacitor having a large capacity has been needed to increase the operation frequency and the number of bits of a converter.

For example, in the case of a Central Processing Unit (CPU) operating at 1 GHz, a capacitor capacity of 400 nF is needed for decoupling. Conventionally, an obtainable capacitance is 34.5 $nF/mm^2$ if an average thickness (Toxeq) of a dielectric film is 1 nm. As a result, an area of 11.6 $mm^2$ is finally needed for a capacitance of 400 nF.

If a dielectric ratio of a conventionally used PECVD SiN of 1000 Å is 7, an approximate $T_{oxeq}$ is 56 nm and a capacitance is 0.62 $nF/mm^2$. Therefore, a capacitor of 645 $mm^2$ area has to be fabricated, and this is a result that is not available in semiconductor chip fabrication.

There is a general tendency that metal line technology of logic devices is moving from Al to Cu. As a result of this technology shift, an insulating film MIM capacitor with a high dielectric ratio for large capacitance is needed. Realization of this type of MIM capacitor in a dual damascene Cu line process is currently viewed as an important research and development goal of logic device manufacturers.

Accordingly, a related art semiconductor device has the following problems.

In the conventional dual damascene line process and the capacitor forming process, it is complicated to fabricate a MIM capacitor having a high dielectric constant and a three-dimensional structure while maintaining the dual damascene patterning process.

SUMMARY OF THE INVENTION

The invention, in part, provides a semiconductor device and a method for fabricating the same that substantially solves one or more problems due to limitations and disadvantages of the related art.

The invention, in part, provides a semiconductor device and a method for fabricating the same which simplifies process steps and forms a MIM capacitor on the same level with a dual damascene Cu line.

The invention, in part, pertains to a semiconductor device that includes a first insulating interlayer on a substrate with a plurality of first contact holes, a plurality of first metal lines formed in the first contact holes, second and third insulating interlayers sequentially formed on the substrate including the first metal lines, second and third contact holes formed in the second insulating interlayer to expose some region of the first metal lines, and a trench formed in the third insulating interlayer to correspond to the second and third contact holes respectively. A first barrier metal film, a lower electrode of a capacitor, a dielectric film, and an upper electrode of a capacitor are sequentially formed in the second contact hole and the trench above the second contact hole. Second barrier metal films are respectively formed over the upper electrode of the capacitor of the second contact hole and the trench above the third contact hole. Second metal lines are respectively formed over the second contact hole, the third contact hole and the second barrier metal film to fill the trench.

The invention, in part, pertains to a diffusion barrier film formed over the first insulating interlayer. The semiconductor device can further have an etching stopper formed over the second insulating interlayer. A hard mask can be formed over the third insulating interlayer. Also, each trench above the second and third contact holes can have a greater width than widths of the second and third contact holes. Also the second contact hole, the trench above the second contact hole, the third contact hole, and the trench above the third contact hole can be respectively formed in a dual damascene structure. Preferably, the first and second metal lines are formed of Cu. In an additional embodiment, the second metal line is formed by combining a seed Cu film with an electroplated Cu film by a chemical and mechanical deposition or by combining a seed Cu film with an electroplated Cu film by an electroless method. In the device, the capacitor is preferably in a same level as the second metal lines.

In another preferred embodiment of the invention, a method for fabricating a semiconductor device includes the steps of: providing a substrate; forming a first insulating interlayer having a plurality of first contact holes over the substrate; forming a plurality of first metal lines in the first contact holes; sequentially forming second and third insulating interlayers over the first insulating interlayer; forming a plurality of first trenches on the third insulating interlayer so that at least one of the first trenches corresponds to the first metal lines; forming a first via hole over the second insulating interlayer below the first trenches corresponding to the first metal lines; sequentially forming a first barrier metal film, a first conductive layer, an insulating film, and a second conductive layer over the third insulating interlayer including the first via hole and the first trenches to expose a region of the third insulating interlayer; forming a plurality of second trenches in the exposed third insulating interlayer so that at least one of the second trenches corresponds to the first metal lines; forming a second via hole in the second insulating interlayer below the second trenches corresponding to the first metal lines; forming a second barrier metal film and a third conductive layer on the whole surface; forming a first barrier metal film and a capacitor in the first via hole and the first trench by a polishing process; and forming a second metal line in the second via hole and the second trench to have a same level with the capacitor.

The invention, in part, pertains to the first and the second metal lines being preferably formed of Cu, and the first and second barrier metal films are preferably formed by at least one of Cu, Ta, TaN, TiN, WN, TaC, WC, TiSiN, or TaSiN. Further, the first and the second conductive layers are preferably formed of at least one of Pt, Ru, Ir, or W, and the insulating film is preferably formed of at least one of a Ta oxide, a Ba—Sr—Ti oxide, a Zr oxide, a HF oxide, a Pb—Zn—Ti oxide or a Sr—Bi—Ta oxide. Also, the first and second barrier metal films, the first and second conductive layers, and the insulating film are preferably formed by a PVD (Physical Vapor Deposition) method, a CVD (Chemical Vapor Deposition) method, or an ALD (Atomic Layer Deposition) method.

The method of the invention, in part, preferably has the steps of degassing under a high vacuum after putting a wafer in a barrier metal deposition apparatus, the degassing being performed before respectively forming the first and second barrier metal films; and cleaning using an argon sputter cleaning or a reactive cleaning using a plasma including H in a form of $H_2$ and/or $NH_3$. The third conductive layer can be formed from a Cu film, wherein the third conductive layer is formed by at least one of combining a seed Cu film with an electroplated Cu film by a PVD or CVD, or by combining the seed Cu film with the electroplated Cu film by an electroless Cu deposition.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this application. The drawings illustrate embodiments of the invention and together with the description serve to explain the principle of the invention.

In the drawings.

DETAILED DESCRIPTION OF THE PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description. Reference will now be made in detail to the preferred embodiments of the present invention, examples of which are illustrated in the accompanying drawings.

FIGS. 1A through 1F illustrate sectional views showing a method for fabricating a semiconductor device according to the present invention.

Figure 1A:
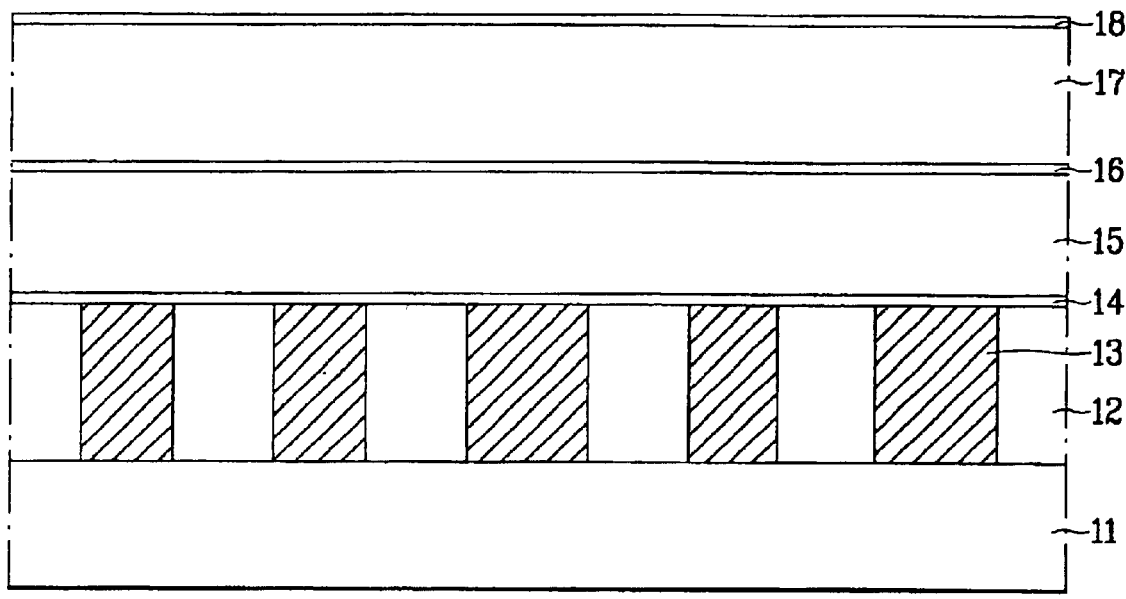
FIGS. 1A through 1F illustrate sectional views showing a method for fabricating a semiconductor device according to the present invention.
Figure 1B:
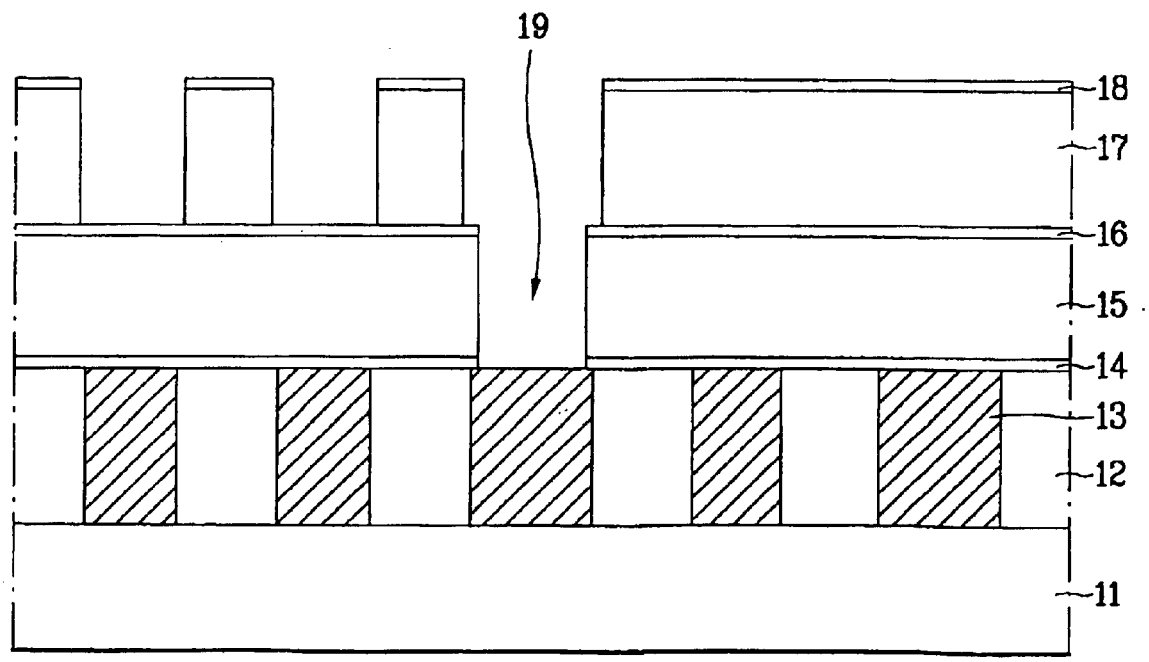
Figure 1C:
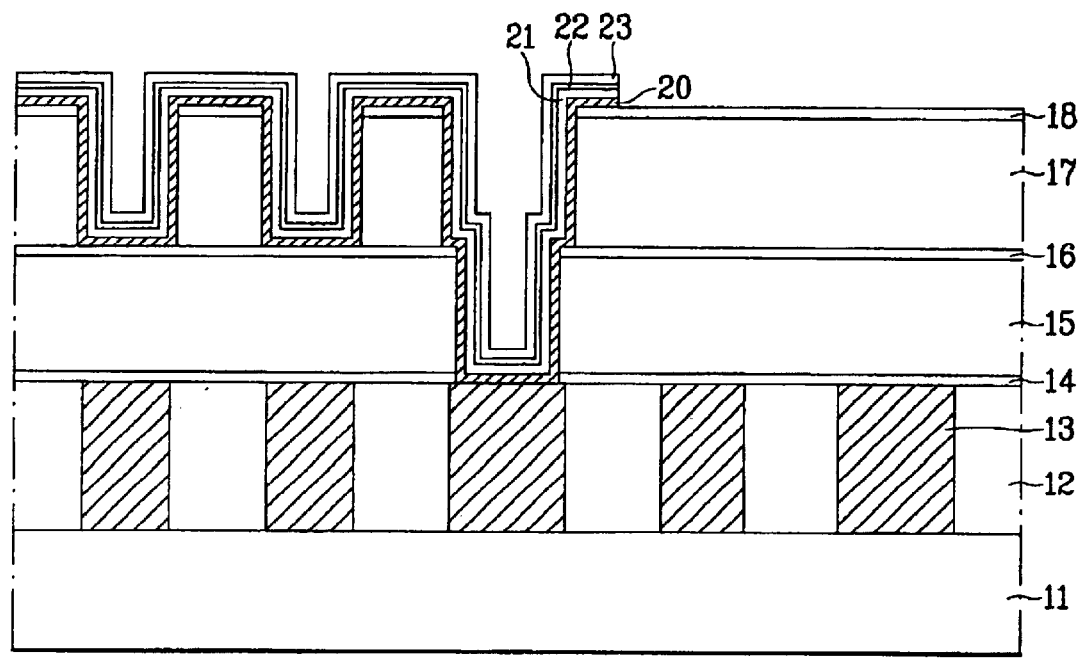
Figure 1D:
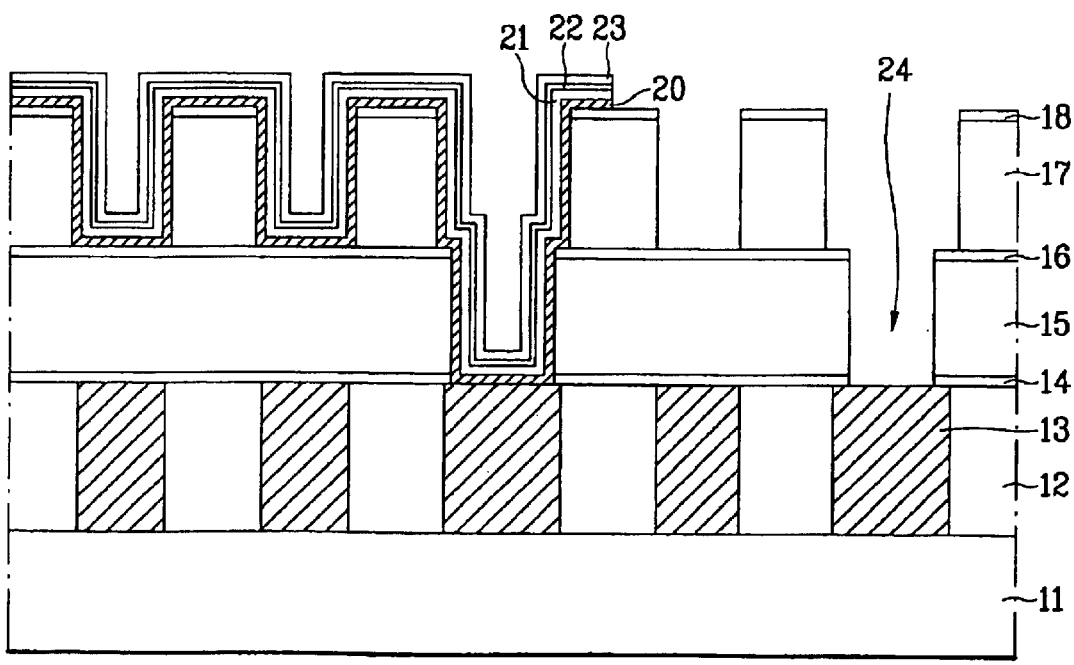
Figure 1E:
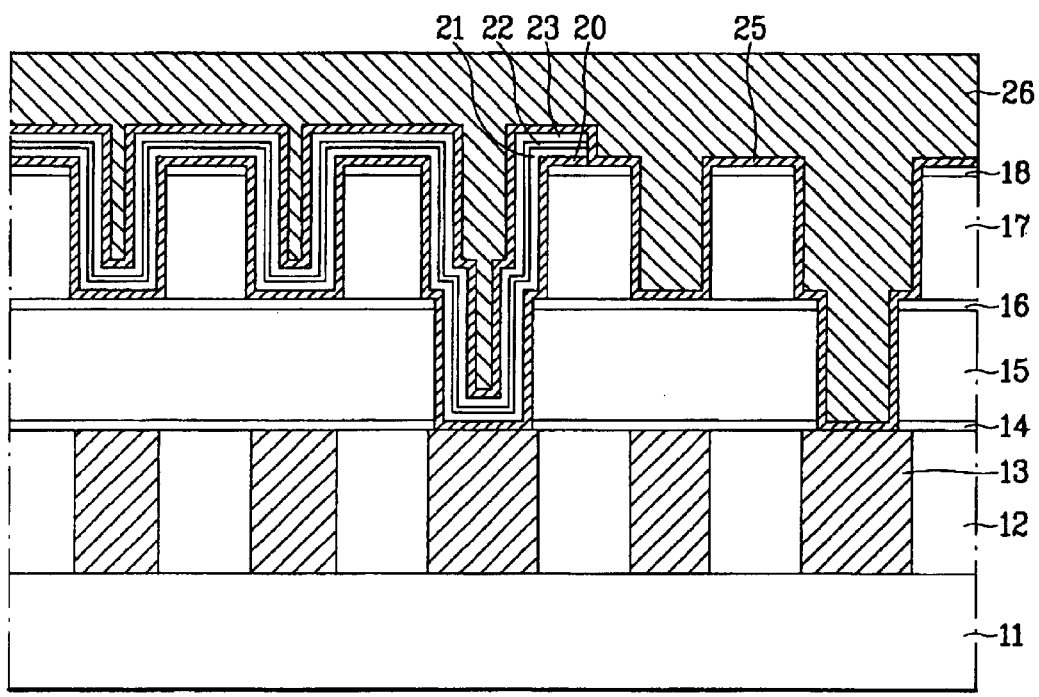
Figure 1F:
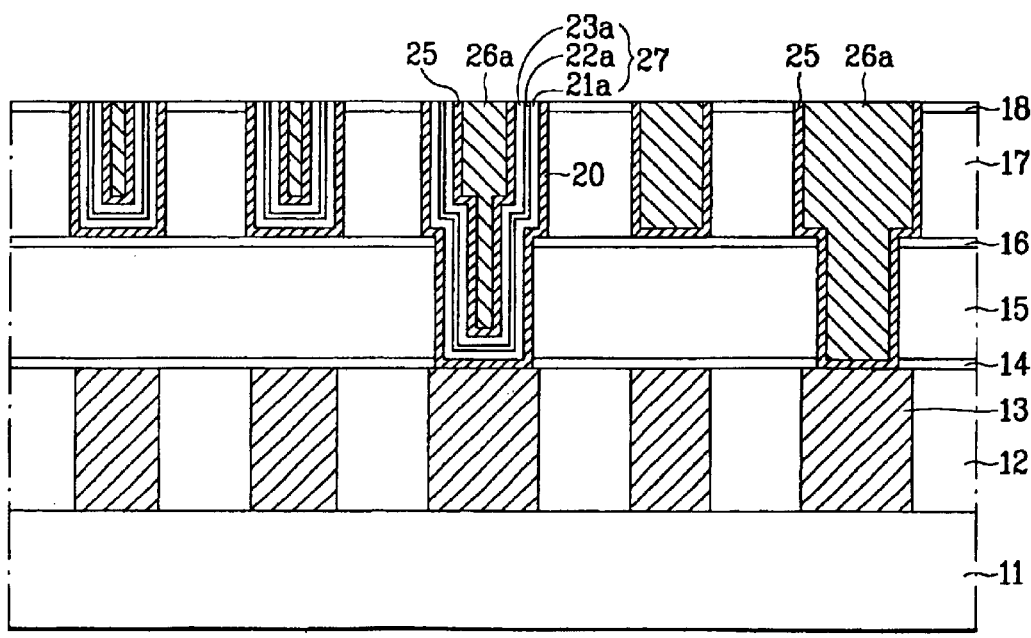

As shown in FIG. 1F, a semiconductor device of a preferred embodiment of the present invention includes a first insulating interlayer 12 having a plurality of contact holes on a silicon substrate 11, and a lower Cu line 13 in each contact hole.

A diffusion barrier film 14, a second insulating interlayer 15, an etching stopper 16, a third insulating interlayer 17, and a hard mask 18 are deposited over the first insulating interlayer 12 including the lower Cu line 13.

A first contact hole (via hole) 19 (see FIG. 1B) and a second contact hole (via hole) 24 (see FIG. 1D) are formed in the second insulating interlayer 15 and the etching stopper 16 to expose a region of the lower Cu line 13.

A trench is respectively formed in the third insulating interlayer 17 and the hard mask 18 at a greater width than widths of the first and second contact holes 19 and 24 to correspond to them.

At this time, the trench is also formed in the third insulating interlayer 17 and the hard mask 18 besides the first and second contact holes to correspond to the lower Cu line 13.

A first barrier metal layer 20, a capacitor lower electrode 21a, a capacitor dielectric film 22a, a capacitor upper electrode 23a, and a second barrier metal layer 25 are sequentially formed in the first contact hole 19 and the trench above the first contact hole. A Cu line 26a is formed on the second barrier metal layer 25 to fill the first contact hole and the trench above the first contact hole. At this time, the capacitor lower electrode 21a, the capacitor dielectric film 22a, and the capacitor upper electrode 23a constitute a capacitor 27.

The second barrier metal layer 25 is formed along the surface of the second contact hole 24 and the trench above the second contact hole 24. Also, the Cu line 26a is formed on the barrier metal layer 25 to fill the second contact hole 24 and the trench above the second contact hole 24.

The first contact hole, the trench above the first contact hole, the second contact hole, and the trench above the second contact hole have a dual damascene structure, respectively.

As discussed above, the following features are formed on the same level as each other: the capacitor 27 formed in the first contact hole, the trench above the first contact hole, the Cu line 26a formed in the second contact hole, and the trench above the second contact.

A method for fabricating the semiconductor device of a preferred embodiment of the present invention is explained below.

Referring to FIG. 1A, a plurality of lower Cu lines 13 are formed in the first insulating interlayer 12 on the silicon substrate 11 by a dual damascene process.

The diffusion barrier film 14, the second insulating interlayer 15, the etching stopper 16, the third insulating interlayer 17, and the hard mask 18 are sequentially formed over the first insulating interlayer 12 including the lower Cu line 13.

At this time, the second insulating interlayer 15 is etched to form a via hole which connects the upper and lower Cu lines with each other in a later process, and the third insulating interlayer 17 is etched to form a trench for the upper Cu line.

The second and third insulating interlayers 15 and 17 are preferably formed from silicon dioxide ($SiO_2$), Fluorine doped Silicate Glass (FSG), or a low dielectric insulating film having a dielectric constant of approximately 1.0–3.0.

The second and third insulating interlayers 15 and 17 are preferably deposited by a Plasma Enhanced Chemical Vapor Deposition (PECVD), High Density Plasma-CVD (HDP-CVD), Atmospheric Pressure CVD (APCVD), or spin coating, that can be processed at a temperature of 450° C. or less.

The diffusion barrier film 14, the etching stopper 16, and the hard mask 18 are preferably formed by depositing SiN, SiC or SiCN by a PECVD method at a thickness of about 100–1000 Å.

The etching stopper 16 and the hard mask 18 may be omitted, depending on the dual damascene patterning method or the film used.

Then, a first photoresist film (not shown) is deposited on the hard mask 18, and the photoresist is then selectively patterned by exposure and developing processes.

Subsequently, the hard mask 18 and the third insulating interlayer 17 are sequentially etched by using the patterned first photoresist film as a mask to form a plurality of trenches, as shown in FIG. 1B. The first photoresist film is then removed.

A second photoresist film (not shown) is deposited on the entire surface and then selectively patterned by exposure and developing processes to expose an upper portion of the etching stopper 16 where a MIM capacitor will be formed.

Then, the etching stopper 16, the second insulating interlayer 15, and the diffusion barrier film 14 are sequentially etched by using the patterned second photoresist film as a mask to form the first contact hole 19 on the lower Cu line 13. The second photoresist film is then removed.

The above method is called a trench first dual damascene process, which forms the trench first and the first contact hole later. Similarly, another method which forms the first contact hole first and patterns the trench structure can be used. Also, a dual damascene process using a dual hard mask can be used.

That is, a method for various well-known dual damascene structures is used to form the trench and contact hole shown in FIG. 1B.

The lower Cu line 13 having a constant region is exposed by the process discussed above, and a trench having a serpentine shape is formed on the etching stopper 16. This structure improves the capacitance in the subsequently formed capacitor.

FIG. 1C shows the sequential formation of the first barrier metal layer 20, the first conductive layer 21, an insulating film 22 and the second conductive layer 23. This capacitor structure is sequentially deposited over the hard mask 18 including the first contact hole 19 and a plurality of trenches.

At this time, the first barrier metal layer 20 is preferably formed of Cu, thereby preventing the capacitor from being electrically degraded by out-diffusion of Cu.

The first barrier metal layer 20 is deposited after placing a wafer in a barrier metal deposition apparatus, performing a degassing process under high vacuum, and then performing an argon sputter cleaning or a reactive cleaning using a plasma including H in a form such as $H_2$ and/or $NH_3$.

The first barrier metal layer 20 can be formed by combining Ta, TaN, TiN, WN, TaC, WC, TiSiN, and TaSiN, besides Cu. The first barrier metal layer 20 can be formed using Physical Vapor Deposition (PVD), Chemical Vapor Deposition (CVD) or Atomic Layer Deposition (ALD).

The first conductive layer 21 is later used to form a capacitor lower electrode. The insulating film 22 is later used to form a dielectric film of the capacitor, and the second conductive layer 23 is later used to form a capacitor upper electrode.

The first and second conductive layers 21 and 23 preferably use a metal such as Pt, Ru, Ir and W, and are deposited by a CVD, a PVD, or an ALD method.

The insulating film 22 is formed of a Ta oxide, a Ba—Sr—Ti oxide, a Zr oxide, a HF oxide, a Pb—Zn—Ti oxide or a Sr—Bi—Ta oxide by a CVD, a PVD, or an ALD method.

Then, a third photoresist film (not shown) is deposited on the second conductive layer 23. The third photoresist film is selectively patterned by exposure and developing processes to remain only in the MIM capacitor region.

The second conductive layer 23, the insulating film 22, the first conductive layer 21, and the first barrier metal layer 20 are sequentially etched by using the patterned third photoresist film as a mask. The third photoresist film is then removed.

Then, a fourth photoresist film (not shown) is deposited on the entire surface including the second conductive layer 23 and the hard mask 18, as shown in FIG. 1D. The fourth photoresist film is then patterned by exposure and developing processes.

Subsequently, the hard mask 18 and the third insulating interlayer 17 are sequentially etched by using the patterned fourth photoresist film as a mask to form a plurality of trenches, as shown in FIG. 1D. The fourth photoresist film is then removed.

A fifth photoresist film (not shown) is deposited over the entire surface by exposure and developing processes. The fifth photoresist film is then selectively patterned to expose an upper portion of the etching stopper 16 where the Cu line will be formed.

Then, the etching stopper 16, the second insulating interlayer 15, and the diffusion barrier film 14 are sequentially etched to form the second contact hole 24 on the lower Cu line 13. The fifth photoresist film is then removed.

The above method is called a trench first dual damascene process, which forms the trench first and the second contact hole later. Similarly, another method that forms the second contact hole first and patterns the trench structure can be used. Also, a dual damascene process using a dual hard mask can be used.

That is, a method for various well-known dual damascene structures is used to form the trench and contact hole, as shown in FIG. 1D.

The dual damascene structure is also applied to a portion where the Cu line will be formed.

FIG. 1E shows the second barrier metal layer 25 being deposited over the entire surface including the second conductive layer 23, the trench, the hard mask 18, and the second contact hole 24.

At this time, the second barrier metal layer 25 is formed of Cu, such as the first barrier metal layer 20, to prevent the capacitor from electrically degrading by out-diffusion of Cu and to prevent insulating characteristics of the insulating film from deteriorating.

The second barrier metal layer 25 is preferably deposited by putting a wafer in a barrier metal deposition apparatus, performing a degassing process under high vacuum, and performing an argon sputter cleaning or a reactive cleaning using a plasma including H in a form such as $H_2$ and/or $NH_3$.

The second barrier metal layer 25 can be formed by combining Ta, TaN, TiN, WN, TaC, WC, TiSiN, and TaSiN, besides Cu. The second barrier metal layer 25 can be formed using Physical Vapor Deposition (PVD), Chemical Vapor Deposition (CVD), or Atomic Layer Deposition (ALD).

Then, a Cu film 26 is sequentially deposited on the entire surface to bury the upper trench and upper portions of the first and second contact holes 19 and 24, as shown in FIG. 1E.

At this time, the Cu film 26 is preferably deposited by combining a seed Cu film with an electroplated Cu film by a PVD or CVD or by combining a seed Cu film with an electroplated Cu film by an electroless Cu deposition, or by combining these methods.

Subsequently, as shown in FIG. 1F, the Cu film 26, the second barrier metal layer 25, the second conductive layer 23, the insulating film 22, the first conductive layer 21, and the first barrier metal layer 20 are polished by a chemical and mechanical polishing process to expose the hard mask 18.

As a result, the first barrier metal layer 20, the capacitor lower electrode 21a, the capacitor dielectric film 22a, the capacitor upper electrode 23a, the second barrier metal layer 25, and the Cu line 26a are sequentially deposited in a dual damascene region of the first contact hole.

Also, the second barrier metal layer 25 and the Cu line 26a are deposited in a dual damascene region of the second contact hole.

At this time, the MIM capacitor 27 includes the capacitor lower electrode, the capacitor dielectric film 22a, and the capacitor upper electrode 23a.

The Cu line 26a is formed to fill the first and second contact holes.

Thus, the MIM capacitor 27 and the Cu line 26a are formed on the same level as each other.

Also, the capacitance can be increased by forming the MIM capacitor 27 in the three-dimensional structure of the damascene structure.

Later, when forming another Cu line, the diffusion barrier film, the insulating interlayer, the etching stopper, the insulating interlayer, and the hard mask may sequentially be deposited again to perform another process sequence.

The semiconductor device and the method for fabricating the semiconductor device have the following advantages.

The MIM capacitor can be fabricated on the same level with the Cu line during a process to form the Cu line in a dual damascene structure. As a result, the number of the metal layers for the MIM capacitor fabrication does not need to increased. Thus, it is easy to simplify the process steps.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method for fabricating a semiconductor device, which comprises:
   providing a substrate;
   forming a first insulating interlayer having a plurality of first contact holes over the substrate;
   forming a plurality of first metal lines in the first contact holes;
   sequentially forming second and third insulating interlayers over the first insulating interlayer and the first metal lines;
   forming a plurality of first trenches in the third insulating interlayer so that at least one of the first trenches corresponds to the first metal lines;
   forming a first via hole in the second insulating interlayer below the first trenches corresponding to the first metal lines;
   sequentially forming a first barrier metal film, a first conductive layer, an insulating film, and a second conductive layer over the third insulating interlayer including the first via hole and the first trenches to expose a region of the third insulating interlayer;
   forming a plurality of second trenches in the exposed third insulating interlayer so that at least one of the second trenches corresponds to the first metal lines;
   forming a second via hole in the second insulating interlayer below the second trenches corresponding to the first metal lines;
   forming a second barrier metal film and a third conductive layer on the whole surface; and
   performing a polishing process to form a first barrier metal pattern and a capacitor in the first via hole and the first trench and to form a second metal line in the second via hole and the second trench, wherein the second metal line and the capacitor have the same level and profile.

2. The method as claimed in claim 1, wherein the first and the second metal lines comprise Cu.

3. The method as claimed in claim 1, wherein the first and second barrier metal films are formed by at least one material selected from the group consisting of Cu, Ta, TaN, TiN, WN, TaC, WC, TiSiN, and TaSiN.

4. The method as claimed in claim 1, wherein the first and the second conductive layers are formed of at least one of Pt, Ru, Ir, or W.

5. The method as claimed in claim 1, wherein the insulating film is formed of at least one of a Ta oxide, a Ba—Sr—Ti oxide, a Zr oxide, a HF oxide, a Pb—Zn—Ti oxide or a Sr—Bi—Ta oxide.

6. The method as claimed in claim 1, wherein the first and second barrier metal films, the first and second conductive layers, and the insulating film are formed by a PVD (Physical Vapor Deposition) method, a CVD (Chemical Vapor Deposition) method, or an ALD (Atomic Layer Deposition) method.

7. The method as claimed in claim 1, further comprising the steps of:
   degassing under a high vacuum after putting a wafer in a barrier metal deposition apparatus, the degassing being performed before respectively forming the first and second barrier metal films; and
   cleaning using an argon sputter cleaning or a reactive cleaning using a plasma including H in a form of $H_2$ and/or $NH_3$.

8. The method as claimed in claim 1, wherein the third conductive layer comprises a Cu film.

9. The method as claimed in claim 1, wherein the third conductive layer is formed by at least one of combining a seed Cu film with an electroplated Cu film by a PVD or CVD, or by combining the seed Cu film with the electroplated Cu film by an electroless Cu deposition.

* * * * *